US 8,182,862 B2
May 22, 2012

(12) United States Patent
Selvamanickam et al.

(10) Patent No.: US 8,182,862 B2
(45) Date of Patent: May 22, 2012

(54) ION BEAM-ASSISTED HIGH-TEMPERATURE SUPERCONDUCTOR (HTS) DEPOSITION FOR THICK FILM TAPE

(75) Inventors: Venkat Selvamanickam, Wynantskill, NY (US); Hee-Gyoun Lee, Guilderland, NY (US)

(73) Assignee: SuperPower Inc., Schenectady, NY (US)

( * ) Notice: Subject to any disclaimer, the term of this patent is extended or adjusted under 35 U.S.C. 154(b) by 1610 days.

(21) Appl. No.: 10/456,733

(22) Filed: Jun. 5, 2003

(65) Prior Publication Data
US 2004/0247780 A1     Dec. 9, 2004

(51) Int. Cl.
*B05D 5/12*     (2006.01)
*C23C 14/00*    (2006.01)
*H01L 39/24*    (2006.01)

(52) U.S. Cl. .......... 427/62; 427/529; 427/533; 427/534; 427/551; 427/564; 427/595; 505/325; 505/434; 505/473; 505/470; 505/480; 204/192.11; 204/192.15; 204/192.24

(58) Field of Classification Search .............. 427/62, 427/585, 529, 533, 564, 595, 534, 551; 29/599; 505/325, 434, 473, 477, 480; 204/192.11, 204/192.15, 192.24
See application file for complete search history.

(56) References Cited

U.S. PATENT DOCUMENTS

| 4,925,829 | A | * | 5/1990 | Fujita et al. ................ 505/473 |
| 4,935,383 | A |   | 6/1990 | Nouhi et al. |
| 5,158,931 | A | * | 10/1992 | Noda et al. ................. 505/474 |
| 5,236,509 | A | * | 8/1993 | Sioshansi et al. ............ 118/719 |
| 5,374,613 | A |   | 12/1994 | Noda et al. |
| 5,432,151 | A |   | 7/1995 | Russo et al. |
| 5,650,378 | A | * | 7/1997 | Iijima et al. ................ 505/473 |
| 5,872,080 | A |   | 2/1999 | Arendt et al. |
| 6,143,697 | A |   | 11/2000 | Tatekawa et al. |
| 6,190,752 | B1 |  | 2/2001 | Do et al. |
| 6,214,772 | B1 | * | 4/2001 | Iijima et al. ................ 505/475 |
| 6,238,537 | B1 |  | 5/2001 | Kahn et al. |
| 6,258,472 | B1 |  | 7/2001 | Neumuller et al. |
| 6,610,632 | B2 |  | 8/2003 | Honjo et al. |
| 6,759,807 | B2 | * | 7/2004 | Wåhlin ................ 315/111.21 |
| 2004/0168636 | A1 | * | 9/2004 | Savvides et al. ......... 118/723 CB |

FOREIGN PATENT DOCUMENTS

| JP | 01-157480 | * | 6/1989 |
| JP | 01-261204 | * | 10/1989 |
| JP | 02-137785 | * | 5/1990 |
| JP | 2002-203439 A |  | 7/2002 |
| JP | 2002-265221 A |  | 9/2002 |
| WO | WO 95/03938 | * | 2/1995 |
| WO | WO95/03938 A1 |  | 2/1995 |
| WO | 02/095084 A1 |  | 11/2002 |

OTHER PUBLICATIONS

Thick film YBCO for wires and tapes: Scale-up issues and cost estimates Advances in superconductivity VIII, Proc. 8th, International symposium superconductivity, Tokyo 1996.*
The Irradiation effects of an oxygen radical beam on the preparation of superconducting thin films, Japanese Journal of Applied Physics, vol. 30, No. 5A, May 1991, pp. L834-L837.*

* cited by examiner

*Primary Examiner* — Brian K Talbot
(74) *Attorney, Agent, or Firm* — Abel Law Group, LLP

(57) ABSTRACT

An ion source impinging on the surface of the substrate to be coated is used to enhance a MOCVD, PVD or other process for the preparation of superconducting materials.

18 Claims, 2 Drawing Sheets

ION BEAM-ASSISTED HIGH-TEMPERATURE SUPERCONDUCTOR (HTS) DEPOSITION FOR THICK FILM TAPE

FIELD OF THE INVENTION

The present invention relates to the manufacture of thick film high-temperature superconductor (HTS) coated wire having increased current capability.

BACKGROUND OF THE INVENTION

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century.

HTS-coated wire offers best-in-class performance, carrying over one hundred times more current than conventional copper and aluminum conductors of the same physical dimension do. The superior power density of HTS-coated wire will enable a new generation of power industry technologies. It offers major size, weight, and efficiency benefits. HTS technologies will drive down costs and increase the capacity and reliability of electric power systems in a variety of ways. For example, HTS-coated wire is capable of transmitting two to five times more power through existing rights of way. This new cable will offer a powerful tool to improve the performance of power grids while reducing their environmental footprint. However, to date only short samples of the HTS tape used in the manufacture of next-generation HTS-coated wires have been fabricated at high performance levels. In order for HTS technology to become commercially viable for use in the power generation and distribution industry, it will be necessary to develop techniques for continuous, high-throughput production of HTS tape.

Vapor deposition is a process for manufacturing HTS tape where vapors of superconducting materials are deposited on a tape substrate, thereby forming an HTS coating on the tape substrate. Well-known vapor deposition processes that show promise for the high-throughput cost-effective production of HTS tapes include metalorganic chemical vapor deposition (MOCVD) and pulsed laser deposition (PLD). With the use of MOCVD or PLD processes, HTS film, such as yttrium-barium-copper-oxide ($YBa_2Cu_3O_7$ or "YBCO") film, may be deposited onto a heated buffered metal substrate to form an HTS-coated conductor. However, to date only short lengths of coated conductor wire samples have been fabricated at high performance levels with any of the above processes. Several challenges must be overcome in order to enable the cost-effective production of long lengths (i.e., several kilometers) of HTS-coated conductor.

One way to characterize coated conductors is by their cost per meter. Furthermore, cost and performance can be characterized as the cost per kiloamp-meter. More specifically, by increasing the current for a given cost per meter of coated conductor the cost per kiloamp-meter is reduced. This is stated as the critical current (Jc) of the deposited HTS material multiplied by the cross-sectional area of the film.

For a given critical current and width of coated conductor, one way to increase the cross-sectional area is by increasing the HTS film thickness. However, it has been demonstrated that with critical current as a function of thickness, the critical current may drop off and reach saturation as the thickness of a single layer of HTS film increases beyond approximately 1.5 microns. This is because beyond a film thickness of approximately 1.5 microns the HTS material becomes very porous, develops voids, and develops increased surface roughness, all of which contribute to inhibiting the flow of current. Since simply increasing the HTS film thickness does not result in a corresponding increase in critical current, a technical challenge exists in increasing the film thickness beyond 1.5 microns while also achieving a corresponding increase in critical current of an HTS-coated conductor in a cost-effective manner.

One approach to achieving high-quality YBCO thick films is to improve the morphology of the film, such as by increasing material density and smoothness, as the thickness exceeds 1.5 microns, thereby resulting in increased current capacity. Tatekawa, et al., U.S. Pat. No. 6,143,697, dated Nov. 7, 2000 and entitled "Method for Producing Superconducting Thick Film," describes a method of producing a superconducting thick film that involves the steps of forming a thick layer comprising a superconducting material on a substrate; firing the thick layer formed on the substrate; subjecting the fired thick layer to cold isostatic pressing; and re-firing the thick layer subjected to cold isostatic pressing.

A drawback of Tatekawa, et al., is that while it is a suitable method for forming superconducting oxide thick films, it does not provide a cost-effective way to improve the morphology of the film and thus minimize the film defects, such as high porosity, voids, and surface roughness, and thereby provide thick HTS films having increased critical current. Tatekawa, et al., is therefore not suited for the cost-effective production of high-current HTS-coated conductors.

It is therefore an object of the invention to produce YBCO films with a thickness in excess of 1.5 microns with increased current capacity for use in the manufacture of high-current HTS-coated tape.

BRIEF SUMMARY OF THE INVENTION

The present invention is an ion-assisted HTS thick film continuous deposition process for producing YBCO films with a thickness in excess of 1.5 microns with increased current capacity for use in the manufacture of high-current HTS-coated tape. The ion-assisted HTS thick film deposition process of the present invention includes an ion source that bombards the deposition zone within any well-known deposition process, such as an MOCVD, PLD or sputtering process.

This ion source provides additional energy to the deposition process that results in improved film morphology for film thicknesses above 1.5 microns. This improved film morphology results in, for example, increased material density, improved surface roughness, and reduced porosity. Consequently, as the YBCO film grows to thicknesses exceeding 1.5 microns during the deposition process of the present invention film defects are minimized, which results in an increase in current density of the resulting YBCO thick film.

Ion beam-assisted electron beam evaporation is well known in, for example, optical applications where high-energy ions are focused on the film as it grows, thus forming a very dense, smooth, uniform optical structure. However, to date this technique has not been applied to HTS deposition processes to achieve similar growth enhancements.

The novel aspect of this invention is the inclusion of an ion source in at least the last zone of an at least two zone coating deposition process to enhance the conventional coating process that is occurring within the system of the present invention.

The process of this invention can produce high current density HTS tape having a total coating thickness in excess of 1.5 microns and a critical current density in excess of 200 A per centimeter. In a preferred embodiment the process produces tapes having a total coating thickness in excess of 1.5 microns and a critical current density in excess of 300 A per centimeter and in a most preferred embodiment it produces tapes having a total coating thickness in excess of 1.5 microns and a critical current density in excess of 400 A per centimeter.

DESCRIPTION OF THE INVENTION

For the purpose of illustration, the ion-assisted HTS thick film deposition process of the present invention is disclosed, firstly, in reference to an MOCVD process that is described in FIG. 1 and, secondly, in reference to a PLD process that is described in FIG. 2 below. However, the ion-assisted HTS thick film deposition process of the present invention is not limited to only MOCVD and PLD processes. For example, the ion-assisted HTS thick film deposition process of the present invention may be applied to evaporation and sputtering processes.

Figure 1:
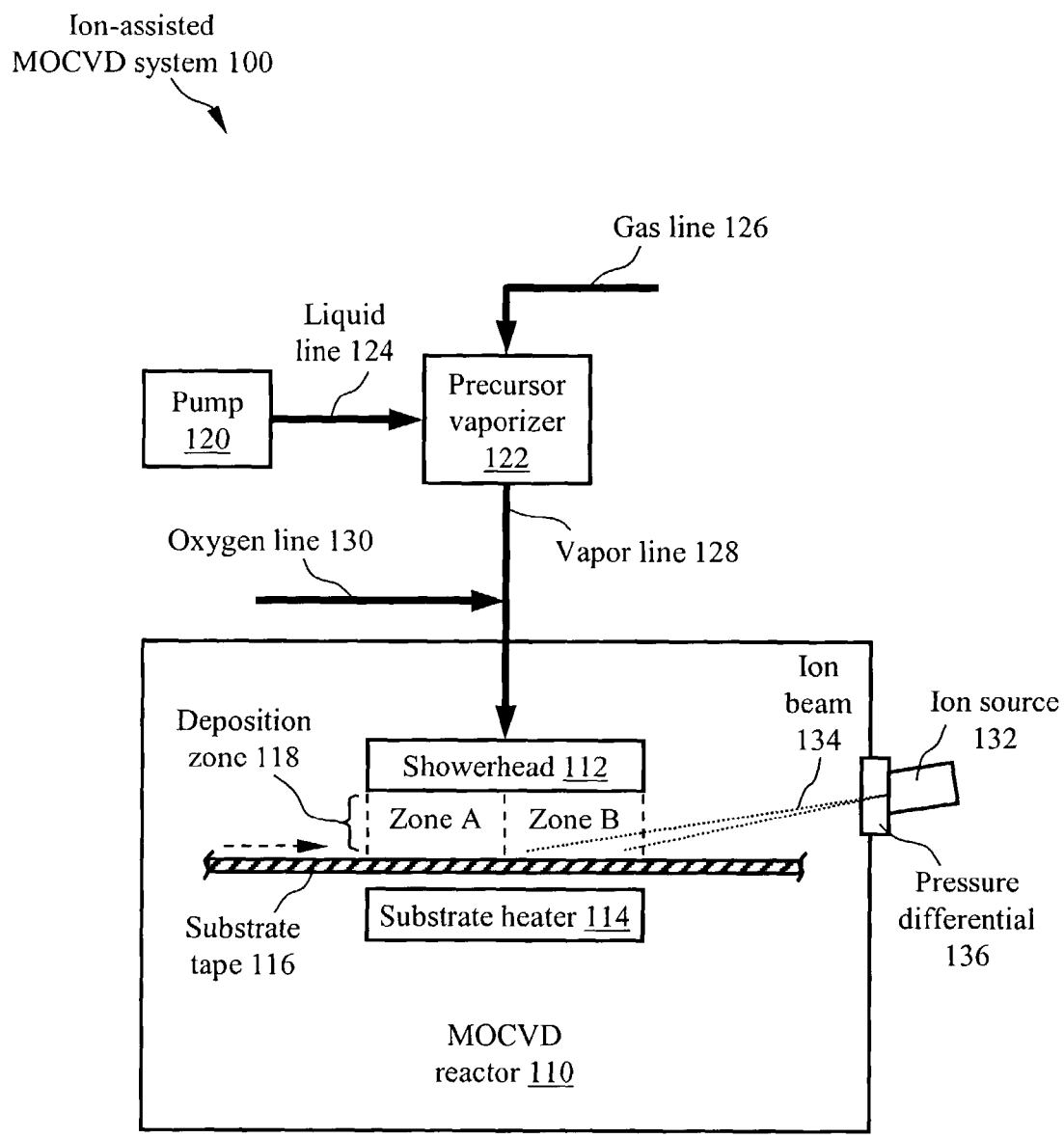
FIG. 1 illustrates an ion-assisted MOCVD system in accordance with the invention for producing high-current HTS-coated tapes by depositing HTS thick film with increased current capability.

As a first embodiment of the invention, FIG. 1 illustrates an ion-assisted MOCVD system 100 in accordance with the invention for producing high-current HTS-coated tapes by depositing HTS thick film with increased current capability. The ion-assisted MOCVD system 100 of the present invention includes a conventional MOCVD reactor 110, which is a vacuum-sealed deposition chamber in which an MOCVD process occurs, such as a cold-wall reactor that may be maintained at a pressure of, for example, 1.6 Torr.

The MOCVD reactor 110 houses a showerhead 112 located in close proximity to a substrate heater 114. A substrate tape 116 is positioned and translates (during operation) between the showerhead 112 and the substrate heater 114 within a deposition zone 118 formed along the length of the showerhead 112, i.e., the area in which the substrate tape 116 is exposed to the precursor vapors. Furthermore, multiple regions within the deposition zone 118 are established, for example, a zone A and a zone B as shown in FIG. 1.

The substrate tape 116 is a flexible length of substrate formed from a variety of materials, such as stainless steel or a nickel alloy such as Inconel, upon which buffer layers, such as yttrium-stabilized zirconia (YSZ) and/or cerium oxide ($CeO_2$) have been previously deposited. The substrate tape 116 is capable of withstanding temperatures up to 950° C. and has dimensions that may vary to meet the desired finished product and system limitations. For example, the substrate tape 116 may have a thickness of 25 microns, a width of 1 cm, and a length of 100 meters.

The showerhead 112 is a device for uniformly distributing precursor vapors onto the substrate tape 116. The surface of the showerhead 112 that is oriented toward the substrate tape 116 includes multiple fine holes evenly distributed throughout its area, through which the precursor vapors exit toward the substrate tape 116. The length of the showerhead 112 and the specific composition of the vapor precursors feeding the showerhead 112 may be user defined depending on the application.

During the deposition process, the temperature of the substrate tape 116 is controlled via the substrate heater 114. The substrate heater 114 is a well-known single or multiple zone substrate heater that provides heating, typically in the range of 700 to 950° C., to the substrate tape 116 via a radiant heating element, such as a lamp. Alternatively, the substrate heater 114 is a resistance heater having a heating element, such as Kanthal or $MoSi_2$.

The ion-assisted MOCVD system 100 further includes a system for the delivery of coating precursors. An exemplary precursor delivery system includes a pump 120 that is fed by a liquid precursor source (not shown) that contains a solution containing organometallic precursors, such as tetramethyl heptanedionate (THD) compounds of yttrium (Y), barium (Ba), and copper (Cu), along with an appropriate mixture of solvents, such as tetrahydrofuran and isopropanol. The pump 120 is a high-pressure, low flow rate pump, such as a high-pressure liquid chromatography (HPLC) pump, capable of a low flow rate between 0.1 and 10 mL/min. The pump 120 feeds a precursor vaporizer 122 via a liquid line 124 formed of tubing or piping.

The precursor vaporizer 122 is a well-known device in which a precursor solution is flash vaporized and mixed with an inert carrier gas, such as argon or nitrogen, for delivery to the showerhead 112. The inert carrier gas is fed into the precursor vaporizer 122 via a gas line 126 formed of tubing or piping. The precursor vapors exit the precursor vaporizer 122 via a precursor vapor line 128 that connects to the inlet of the showerhead 112. The vapor line 128 is a connecting tube or pipe through which the precursor vapor and its inert carrier gas pass on their way from the precursor vaporizer 122 to the showerhead 112.

Just prior to the vapor line 128 entering the MOCVD reactor 110, an oxygen line 130 opens into the vapor line 128. The oxygen line 130 is a tube or pipe through which oxygen passes for introduction to the precursor vapor and its inert carrier gas flowing within the vapor line 128.

The ion-assisted MOCVD system 100 includes an ion source 132 that emits an ion beam 134 that is directed toward the substrate tape 116 within the MOCVD reactor 110. The ion source 132 may be an inexpensive gridless ion bombardment source that is capable of generating a collimated or non-diffused ion beam at a power level typically in the range of 0.5 to 10 KW. An example of the gridless ion source 132 is commercially available from Veeco Instruments, [2330 E Prospect Fort Collins, Colo. 80525] operates at voltages up to 100-1000 eV, and has dimensions of 6 cm by 66 cm. The size and orientation of the ion source 132 is determined based on the length of the substrate tape 116 irradiated and the design of the MOCVD reactor 110. The ion source 132 does not have to be located in close proximity to the deposition zone 118, as the ions of ion beam 134 can travel long distances.

Alternatively, the ion source 132 may be a gridded ion source. However, a gridded ion source is likely to be less desirable than a gridless ion source because, typically, gridded ion sources are more costly than gridless ion sources and function with more stringent pressure requirements than gridless ion sources, i.e., $10^{-4}$ to $10^{-6}$ Torr as compared with $10^{-2}$ to $10^{-3}$ Torr for gridless ion sources.

The pressure interface between the ion source 132 and the MOCVD reactor 110 is accomplished via a pressure differential 136 mounted within the outer wall of the MOCVD reactor 110. The pressure differential 136 is a device that allows the ion source 132 to be held at a typical vacuum pressure in the range of approximately $10^{-4}$ to $10^{-2}$ Torr, while at the same time allowing the MOCVD reactor 110 to be held at a vacuum pressure typically in the range of 1-50 Torr. This can be accomplished by means of a turbomolecular pump or a cryopump. The pressure differential 136 also includes an opening that allows the ion beam 134 to pass into the MOCVD reactor 110.

With reference to the ion-assisted MOCVD system 100 of FIG. 1, the basic MOCVD process is well known in the art and can be summarized as follows. Within the MOCVD reactor 110 of the ion-assisted MOCVD system 100, HTS film, such as YBCO, is deposited by vapor-phase precursors onto the heated substrate tape 116 via chemical reactions that occur at the surface of the substrate tape 116. More specifically, the linear translation of the substrate tape 116 through the deposition zone 118 begins in a direction progressing from zone A to zone B (the mechanisms for translating the substrate tape 116 are not shown), the pump 120 is activated, the precursor vaporizer 122 is activated, and the substrate heater 114 is activated.

The vapor line 128 delivers the yttrium-barium-copper vapor precursor to the showerhead 112, which uniformly directs this vapor precursor toward the substrate tape 116 within the deposition zone 118. The result of the oxygen reacting with the yttrium-barium-copper vapor precursors and then this reacting combination coming into contact with the heated substrate tape 116 within the deposition zone 118 causes the yttrium-barium-copper vapor precursor to decompose and form a layer of YBCO atop the substrate tape 116 as it translates through the deposition zone 118.

The substrate tape 116 experiences the initial accumulation of YBCO film within zone A of the deposition zone 118 where the film thickness builds from zero microns up to 1.0 to 1.5 microns. The substrate tape 116 subsequently experiences further accumulation of YBCO film within zone B of the deposition zone 118, where the film thickness continues to build from approximately 1.5 microns up to 5 microns.

Concurrent with the normal deposition process occurring within the ion-assisted MOCVD system 100 as described above, the ion source 132 is activated and thus emits the ion beam 134. The stream of positive ions forming the ion beam 134 is accelerated toward the substrate tape 116 within the deposition zone 118. More specifically, the ion beam 134 emitting from the ion source 132 is focused upon the substrate tape 116 as it translates through zone B of the deposition zone 118, where the YBCO film is further accumulating and approaching and/or exceeding a thickness of 1.5 microns. Although the process is shown as having two deposition zones A and B, there may be multiple deposition zones, with the requirement that those deposition zones where the substrate has a coating in excess of 1.5 microns thick, have an ion source focused on the substrate tape as it translates through that deposition zone. While it is not an absolute requirement, it may be preferable to have the ion source focused on the substrate even in the first deposition zone where the film is grown to a thickness of 1.5 microns. In this way, it could be assured that a template of a dense film is available for subsequent growth.

As a result, the YBCO deposition process occurring within zone B of the deposition zone 118 is influenced by the ion bombardment provided by the ion beam 134. Due to this ion bombardment, additional energy is added to the deposition process within zone B of the deposition zone 118, which has the effect of minimizing film defects, such as high porosity, voids, and surface roughness, thereby maintaining a high-quality growth template as the YBCO film accumulates by vapor deposition upon the substrate tape 116. As a result, the ion-assisted MOCVD system 100 of the present invention is capable of producing a YBCO film with a thickness in excess of 1.5 microns that has increased material density and smoothness that results in increased current capacity.

There is no particular orientation requirement for the ion source 132 in relation to zone B. Rather, the orientation is governed by the design of the MOCVD reactor 110 because there is an optimum distance between the substrate tape 116 and the showerhead 112. In particular, the orientation of the incident ion beam 134 is governed by the dimension of the showerhead 112 and the substrate heater 114.

The ion beam 134 from the ion source 132 is not focused upon the substrate tape 116 within zone A of the deposition zone 118 where the YBCO film is forming with a thickness that is less than, for example, 1.0 to 1.5 microns. This is because, as stated above, the quality of the YBCO film morphology within the first 1.0 to 1.5 microns of growth is very high and the current capacity is not inhibited.

Although not required to obtain the benefits of the present invention, the ion beam may be allowed to impinge upon the substrate in zone A as well. Ion bombardment may be used within zone A of the deposition zone 118 where the thickness of the YBCO film is less than 1.0 to 1.5 microns to assure that the film is dense, thereby providing a good template for subsequent layers.

Figure 2:
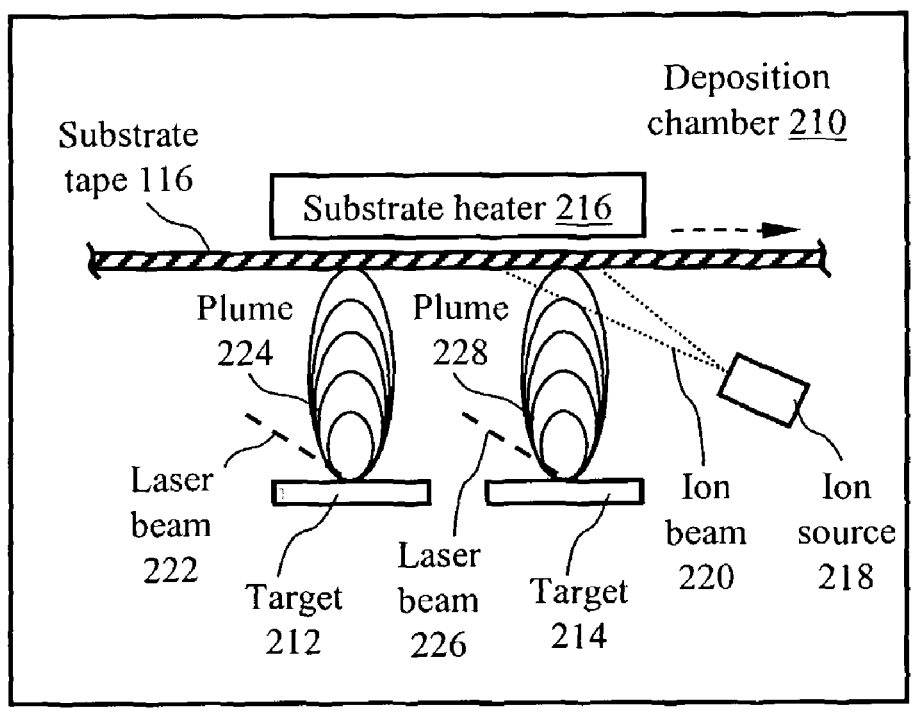
FIG. 2 illustrates an ion-assisted PLD system in accordance with the invention for producing high-current HTS-coated tapes by depositing HTS thick film with increased current capability.

FIG. 2 illustrates a second embodiment of the invention, an ion-assisted PLD system 200 for producing high-current HTS-coated tapes by depositing HTS thick film with increased current capability. The ion-assisted PLD system 200 of the present invention includes a conventional deposition chamber 210, which is a vacuum chamber designed specifically for pulsed laser deposition applications. An example of such a vacuum chamber is a 12- or 18-inch vacuum chamber commercially available by Neocera, [10000 Virginia Manor Road Beltsville, Md. 20705] although those skilled in the art will appreciate that a number of alternative vendors manufacture vacuum chambers in a variety of shapes and sizes. The deposition chamber 210 is maintained at a pressure of, for example, 200 mTorr. In this example, the deposition chamber 210 houses a first target 212 and a second target 214 that are located in close proximity to a substrate heater 216. The substrate tape 116 as described in FIG. 1 is positioned and translates (during operation) between the targets 212 and 214 and the substrate heater 216. The targets 212 and 214 are composed of HTS material, such as YBCO, and are available commercially from suppliers such as Praxair Surface Technologies, Specialty Ceramics [16130 Wood-Red Rd., #7, Woodinville, Wash. 98072] and Superconductive Components, Inc. [1145 Chesapeake Ave., Columbus, Ohio 43212].

During the deposition process, the temperature of the substrate tape 116 is controlled via the substrate heater 216. Like the substrate heater 114 of FIG. 1, the substrate heater 216 is a well-known single or multiple zone substrate heater that provides heating, typically in the range of 750 and 830° C., to the substrate tape 116 via a radiant heating element such as a lamp.

Finally, the ion-assisted PLD system 200 includes an ion source 218 that emits an ion beam 220 that is directed toward the substrate tape 116 within the deposition chamber 210. The ion source 218 is an inexpensive gridless ion bombardment source that is capable of generating a collimated or non-diffused ion beam at a power level typically in the range of 0.5 to 10 KW. An example of a gridless ion source 218 is commercially available from Veeco Instruments, [2330 E Prospect Fort Collins, Colo. 80525] operates at voltages up to 100-1000 eV, and has dimensions of 3 to 6 cm in diameter. The size of the ion source 218, especially the length of the ion source 218, is the similar to the length of the film deposition zone.

There is no particular orientation of the ion source 218 relative to the film deposition zone. Rather, the orientation is governed by the design of the deposition chamber 210 because there is an optimum distance between the substrate tape 116 and the targets 212 and 214. In particular, the orientation of the incident ion beam 218 is governed by the dimension of the targets 212 and 214 and the substrate heater 216. The ion source 218 does not have to be located in close proximity to the substrate tape 116, as the ions of ion beam 220 can travel long distances. Alternatively, the ion source 218 is a gridded ion source.

With reference to the ion-assisted PLD system 200 of FIG. 2, the basic PLD process is well known in the art and need only be summarized as follows. Within the deposition chamber 210 of the ion-assisted PLD system 200, HTS film, such as YBCO, is deposited by the evaporation of HTS material and the subsequent exposure of the heated substrate tape 116 to this evaporant. More specifically, the linear translation of the substrate tape 116 through the deposition chamber 210 begins in a direction that first passes by the target 212 and then by the target 214 that are arranged along the substrate tape 116 line of travel (the mechanisms for translating the substrate tape 116 are not shown). The substrate heater 216 is activated.

A first laser source (not shown) is activated and generates a laser beam 222 that impinges upon the surface of the target 212, causing the formation of a plume 224, which emanates from that portion of the target 212 radiated by the laser beam 222 toward the substrate tape 116 in a highly forward-directed fashion. In like manner, a second laser source (not shown) is activated and generates a laser beam 226 that impinges upon the surface of the target 214, causing the formation of a plume 228, which emanates from that portion of the target 214 radiated by the laser beam 226 toward the substrate tape 116 in a highly forward-directed fashion.

The plumes 224 and 228 are plasma clouds resulting from the material of targets 212 and 214, respectively, melting and subsequently evaporating explosively when impinged upon by the laser beams 222 and 226, respectively.

The YBCO particles contained in the plume 224 are thus deposited onto the surface of the substrate tape 116 as the tape translates through the deposition chamber 210 at a predetermined speed.

The substrate tape 116 experiences the initial accumulation of YBCO film via exposure to the YBCO particles contained in the plume 224 as the substrate tape 116 translates through the deposition chamber 210 at a predetermined speed. Due to exposure to the particles of the plume 224, the film thickness upon the surface of the substrate tape 116 builds from zero microns up to 1.0 to 1.5 microns. The substrate tape 116 subsequently experiences further accumulation of YBCO film via exposure to the YBCO particles contained in the plume 228 as the substrate tape 116 translates through the deposition chamber 210 at a predetermined speed. Due to exposure to the particles of the plume 228, the film thickness upon the surface of the substrate tape 116 builds from approximately 1.5 microns up to 5 microns.

Concurrent with the normal deposition process occurring within the ion-assisted PLD system 200 as described above, the ion source 218 is activated and thus emits the ion beam 220. The stream of positive ions forming the ion beam 220 is accelerated toward the substrate tape 116 and is focused upon the substrate tape 116 as it translates through the particles of the plume 228 where the YBCO film is further accumulating and approaching and/or exceeding a thickness of 1.5 microns. As a result, the YBCO deposition process occurring via exposure to the particles of the plume 228 is influenced by the ion bombardment provided by the ion beam 220. Although the process is shown as having two plumes, there may be multiple plumes, with the requirement that those deposition zones where the substrate has a coating in excess of 1.5 microns thick, have an ion source focused on the substrate tape as it translates through the plume defining that deposition zone.

Due to this ion bombardment, additional energy is added to the deposition process occurring due to exposure to the particles of the plume 228, which has the effect of minimizing film defects, such as high porosity, voids, and surface roughness, thereby maintaining a high-quality growth template as the YBCO film accumulates by vapor deposition upon the substrate tape 116. As a result, the ion-assisted PLD system 200 of the present invention is capable of producing a YBCO film with a thickness in excess of 1.5 microns that has increased material density and smoothness that results in increased current capacity.

The ion beam 220 from the ion source 218 need not be focused upon the substrate tape 116 as it is exposed to the plume 224 where the YBCO film is forming with a thickness that is less than, for example, 1.0 to 1.5 microns. This is because, as stated above, the quality of the YBCO film morphology within the first 1.0 to 1.5 microns of growth is still very high and, thus, the current capacity is not inhibited.

Alternatively, however, ion bombardment may be used in the area where the substrate tape 116 is exposed to the plume 224 where the thickness of the YBCO film is less than 1.0 to 1.5 microns. In particular, using ion bombardment in the area where the substrate tape 116 is exposed to the plume 224 can assure that the film is dense, thereby providing a good template for subsequent layers.

What is claimed is:

1. A process for continuously producing high current density HTS tape having a coating thickness in excess of 1.5 microns and a critical current in excess of 200 A per centimeter width comprising:
  applying a first thickness of superconductor coating to a substrate as it translates through a first deposition zone in a deposition reactor; and
  immediately applying an additional thickness of superconductor coating to the substrate as it translates through at least one additional deposition zone in the deposition reactor while supplying oxygen in the at least one additional deposition zone, where the substrate is impinged upon by an ion beam during applying the additional thickness of superconductor coating, separate from supply of the oxygen, wherein impingement of the ion beam improves film morphology, reduces defects, and increases current density, and wherein impingement of the ion beam is carried out on the superconductor coating in a state wherein the superconductor coating has a thickness of greater than 1.0 micron.

2. The process of claim 1 which is a MOCVD process.

3. The process of claim 1 which is a PVD process.

4. The process of claim 1 which is a sputtering process.

5. The process of claim 1 where there are two deposition zones.

6. The process of claim 1 where the ion beam also impinges upon the substrate in the first deposition zone.

7. The process of claim 1 where the critical current is in excess of 300 A per centimeter width.

8. The process of claim 1 where the critical current is in excess of 400 A per centimeter width.

9. The process of claim 1, wherein the superconductor coating comprises a yttrium barium copper oxide superconducting material.

10. The process of claim 9, wherein the yttrium barium copper oxide superconducting material comprises $YBa_2Cu_3O_7$.

11. A process for producing a superconductor tape, comprising:
   translating a substrate tape through a deposition zone;
   forming a thickness of superconductor coating in excess of 1.5 microns on the substrate tape while supplying oxygen to the deposition zone; and
   impinging an ion beam on the superconductor coating during forming, thereby improving morphology, reducing defects in the superconductor coating, and increasing the current density, where the oxygen is supplied to the deposition zone separately from the ion beam, wherein impinging the ion beam is carried out on the superconductor coating in a state wherein the superconductor coating has a thickness of greater than 1.0 micron.

12. The process of claim 11, wherein the superconductor coating comprises a high temperature superconductor.

13. The process of claim 12, wherein the high temperature superconductor comprises yttrium-barium-copper-oxide.

14. The process of claim 13, wherein the high temperature superconductor comprises $YBa_2Cu_3O_7$.

15. The process of claim 11, wherein the superconducting coating is formed by a chemical vapor deposition process.

16. The process of claim 11, wherein the superconductor coating has a critical current in excess of 200 A per centimeter width.

17. The process of claim 11, wherein reducing defects includes at least one of reducing porosity, reducing voids, reducing surface roughness, or increased material density.

18. A process for producing a superconductor tape, comprising:
   translating a substrate tape through a deposition zone;
   forming, by MOCVD, a thickness of superconductor coating in excess of 1.5 microns on the substrate tape while supplying oxygen to the deposition zone; and
   impinging an ion beam on the superconductor coating during forming, thereby improving morphology, reducing defects in the superconductor coating, and increasing the current density, where the oxygen is supplied to the deposition zone separately from the ion beam, wherein impinging the ion beam is carried out on the superconductor coating in a state wherein the superconductor coating has a thickness of greater than 1.0 micron.

* * * * *